United States Patent
Hauf et al.

(10) Patent No.: US 7,316,969 B2
(45) Date of Patent: Jan. 8, 2008

(54) METHOD AND APPARATUS FOR THERMALLY TREATING SUBSTRATES

(75) Inventors: Markus Hauf, Ichenhausen (DE); Christoph Striebel, Dornstadt (DE)

(73) Assignee: Mattson Technology, Inc., Fremont, CA (US)

( * ) Notice: Subject to any disclaimer, the term of this patent is extended or adjusted under 35 U.S.C. 154(b) by 19 days.

(21) Appl. No.: 11/446,675

(22) Filed: Jun. 5, 2006

(65) Prior Publication Data

US 2006/0291834 A1 Dec. 28, 2006

Related U.S. Application Data

(62) Division of application No. 10/478,754, filed as application No. PCT/EP02/05683 on May 23, 2002, now Pat. No. 7,056,389.

(30) Foreign Application Priority Data

May 23, 2001 (DE) ................. 101 25 318
May 23, 2002 (DE) ................. 102 22 879

(51) Int. Cl.
*H01L 21/20* (2006.01)
(52) U.S. Cl. ............ 438/502; 438/509; 438/660; 257/E21.084; 257/E21.077
(58) Field of Classification Search ........... 438/502, 438/509, 660; 250/503.1; 257/E21.084, 257/E21.077
See application file for complete search history.

(56) References Cited

U.S. PATENT DOCUMENTS

| | | | |
|---|---|---|---|
| 3,471,698 A | 10/1969 | Mausteller et al. | |
| 4,891,499 A | 1/1990 | Moslehi | |
| 5,154,512 A | 10/1992 | Schietinger et al. | |
| 5,359,693 A | 10/1994 | Nenyei et al. | |
| 5,444,815 A | 8/1995 | Lee et al. | |
| 5,628,564 A | 5/1997 | Nenyei et al. | |
| 5,668,376 A * | 9/1997 | Weckstrom et al. | 250/495.1 |
| 5,727,017 A | 3/1998 | Maurer et al. | |
| 5,790,750 A | 8/1998 | Anderson | |
| 5,790,751 A | 8/1998 | Gronet et al. | |
| 5,861,609 A | 1/1999 | Kaltenbrunner et al. | |

(Continued)

FOREIGN PATENT DOCUMENTS

EP 0612862 A1 8/1994

(Continued)

OTHER PUBLICATIONS

Abstract of DE19905524, Sep. 21, 2000.

(Continued)

*Primary Examiner*—Matthew Smith
*Assistant Examiner*—Thanh Van Pham
(74) *Attorney, Agent, or Firm*—Dority & Manning, P.A.

(57) ABSTRACT

The object of the disclosure is to measure temperature using pyrometers, in a simple and economic way, enabling precise temperature measurement, even for low temperatures. The disclosure presents an apparatus and method for thermally treating substrates, wherein the substrate is exposed to at least a first and at least a second radiation; the predetermined wavelengths of the first radiation are absorbed between the first radiation source and the substrate; a radiation from the substrate is measured in the predetermined wavelength using a radiation detector arranged on the same side as a second radiation source; the second radiation from the second radiation source is modulated and determined.

15 Claims, 5 Drawing Sheets

U.S. PATENT DOCUMENTS

| | | |
|---|---|---|
| 5,960,158 A | 9/1999 | Gat et al. |
| 6,191,392 B1 | 2/2001 | Hauf et al. |
| 6,310,328 B1 | 10/2001 | Gat |
| 6,359,263 B2 | 3/2002 | Tay et al. |
| 6,369,363 B2 | 4/2002 | Hauf et al. |
| 6,434,327 B1 | 8/2002 | Gronet et al. |
| 6,462,315 B2 | 10/2002 | Hauf |
| 6,614,005 B1 | 9/2003 | Walk et al. |
| 6,775,471 B2 | 8/2004 | Blersch et al. |

FOREIGN PATENT DOCUMENTS

| | | |
|---|---|---|
| WO | 0034986 A1 | 6/2000 |

OTHER PUBLICATIONS

Abstract of DE4012614, Oct. 24, 1991.

* cited by examiner

METHOD AND APPARATUS FOR THERMALLY TREATING SUBSTRATES

RELATED APPLICATIONS

The present application is a divisional application of U.S. patent application Ser. No. 10/478,754 filed on Apr. 9, 2004 now U.S. Pat. No. 7,056,389, and which claims priority to PCT Application No. PCT/EP02/05683 filed 23 May 2002.

BACKGROUND OF THE INVENTION

The present invention relates to a method and to an apparatus for the thermal treatment of substrates, especially semiconductor wafers.

Computer chips, as well as other electronic components, are produced on semiconductor disks, so-called wafers, which are subjected to thermal processes during the manufacturing sequence. These thermal processes require a defined temperature profile of the wafer at a defined atmosphere, in vacuum or defined underpressure or over pressure.

For the temperature treatment of wafers, rapid heating units, also known as RTP units (Rapid Thermal Processing units), are being emphasized more and more. With these units a rapid and well-defined thermal treatment of wafers under prescribed process conditions is possible. RTP units permit a heating of the wafer that is to be treated, as a function of the wafer material, up to 1700° C. and more within a few seconds. A controlled or regulated heating up of the wafer pursuant to prescribed temperature-time curves at heating rates of up to 300° C./s can be achieved with today's units for silicon wafers having a diameter of 300 mm. Higher heating rates of up to 500° C./s can be achieved in an open-loop operation, or with wafers having smaller diameters. RTP units are used in particular for the manufacture of dielectric layers (e.g. $SiO_2$ layer which is produced by oxidation on a silicon wafer, silicon nitride layers, silicon oxynitride layers), implant-annealing processes (for the activation of foreign atoms in the semiconductor wafer), processes for the annealing of dielectric layers, processes for the formation of ohmic contacts, flash-annealing processes (e.g. for the activation of flat doped zones), siliciding processes (e.g. Ti—Co—Ni-silicide), BPSG-reflow processes or processes with which selective reactions are effected in the surface region of the wafer, such as selective oxidation of a gate-dielectric that is disposed below a metal layer, just to name a few processes. Furthermore, by means of modern RTP units, the spatial distribution of foreign atoms, of vacancies, of oxygen and oxygen precipitates can be influenced in a precise manner. A significant advantage of RTP units is that generally, due to the shortened process time during the processing of the wafers, the wafers are individually processed, whereby each wafer undergoes the same process with very high reproducibility. This advantageously reduces the thermal stress of the wafer. Furthermore, due to the possibility of the rapid heating and the rapid cooling off, the RTP units provide for the production of new wafer or component characteristics that could not be achieved with conventional furnace processes. In order to be able to subject a substrate, such as a semiconductor wafer of silicon, to temperature changes of up to several hundred degrees per second, the wafer is heated in a rapid heating unit, such as is known from DE-A-199 05 524, which originates with the applicant, with radiation from lamps, preferably halogen lamps. The known rapid heating unit has a process chamber (preferably of quartz glass) that is essentially transparent for the lamp radiation and serves for accommodating a substrate. Disposed above and below the process chamber are heat lamps that produce electromagnetic radiation for the thermal treatment of the substrate. The heat lamps and the process chamber can be surrounded by a further chamber (reflector chamber) that can have reflective inner walls in order to reflect the electromagnetic radiation produced by the heat lamps.

A process chamber made of quartz glass is essentially transparent for the spectrum of the electromagnetic radiation that is produced by the heat lamps. The process chamber has inlets and outlets for process gases by means of which a suitable gas atmosphere can be produced within the process chamber during the thermal treatment of the substrate. With suitable dimensioning of the process chamber, it is also possible to produce an underpressure or an overpressure in the chamber.

To measure the wafer temperature, radiation detectors, such as pyrometers, are preferably provided that measure the thermal radiation of the wafer. From the measured thermal radiation of the wafer, it is possible to draw a conclusion with regard to the temperature thereof. To differentiate among the radiation emitted from the wafer, as well as radiation reflected on the wafer and radiation passing through the wafer, the radiation of the heat lamps is modulated. As a result of this modulation, the radiation emitted from the substrate can be differentiated from the radiation reflected at the substrate and the radiation of the heat lamps that passes through. Furthermore, due to the modulation, the reflectivity and transmissivity, and from there the emissivity, of the wafer can be determined, which for a temperature measurement of the wafer is necessary due to the radiation being emitted therefrom. Details of the modulation and of the temperature determination process can be obtained from the aforementioned DE-A-199 05 524 or from U.S. Pat. No. 5,154,512.

However, the temperature measurement based on pyrometers has the problem that there is present in the process or reflector chamber a strong radiation field that makes a differentiation of the radiation emitted from the wafer from the background radiation emitted from the heat lamps difficult. The temperature radiation that is emitted from the wafer and is to be measured by the radiation detector can be superimposed or overridden by the background radiation of the heat lamps. As a consequence, there results a very unfavorable signal (radiation emitted from the wafer) to the background (background radiation emitted from the heat lamps) ratio. This problem is increased in particular with low wafer temperatures, since the radiation emitted from the wafer rapidly decreases as the temperature decreases. Therefore, at low wafer temperatures the signal-to-background-ratio is also reduced. Below approximately 400° to 500° Celsius the wafer emits only a very low radiation, and furthermore below this temperature, in the case of a silicon wafer, the wafer is transparent for the heat radiation, so that the signal-to-background-ratio becomes even worse. For temperatures less than 400° Celsius, it is therefore generally not possible with the conventional process to determine the wafer temperature with a pyrometer.

To improve the signal-to-background-ratio with a pyrometer-based temperature measurement in RTP units, it is proposed in DE-A-40 12 614 to make the process chamber from an OH-containing quartz material. Such a quartz material has the characteristic of absorbing infrared light in the wavelength range of between 2.7 µm and 2.8 µm. Thus the wafer that is disposed in the process chamber is heated by a radiation, the spectrum of which has a gap between 2.7 µm and 2.8 µm. Provided in the quartz chamber is a sight window that is transparent in the aforementioned wavelength range, and through which a pyrometer is directed onto the wafer. The pyrometer now measures infrared radiation of the wavelength 2.7 µm coming from the wafer. Since the radiation in the wavelength of 2.7 µm emitted from the heat lamps cannot penetrate into the process chamber, the pyrometer measures only temperature radiation emitted from the wafer. With this method, the radiation intensity of the wafer can be well determined, and hence the radiation temperature can be determined. However, if the emissivity of the wafer deviates significantly from 1, which is the case in conventional practice, it is necessary to have an emissivity correction for the determination of the wafer temperature, or a calibration relative to the absolute wafer temperature must be undertaken.

Thus, with known methods the temperature radiation of the wafer can be well determined. However, in practice for the temperature determination of the wafer it is also necessary to know the reflectivity and transmissivity thereof at the wavelength 2.7 µm. This reduces the effort and expense of any calibration process.

The method known from DE-A-199 05 524 for the determination of the reflectivity, transmissivity and the emissivity resulting therefrom, and which utilizes a characteristic modulation to measure reflected radiation and radiation passing through the wafer, can be realized at temperatures below 400° to 500° only with very high expense for apparatus, since at these temperatures the signal-to-background ratio is very small.

It is therefore an object of the present invention, in a simple and economical manner, to provide a pyrometer-based temperature measurement of substrates that enables an exact temperature measurement, even at low temperatures.

SUMMARY OF THE INVENTION

Pursuant to the present invention, this object is realized by an apparatus, for the thermal treatment of substrates, especially semiconductor wafers, that has at least one first and at least one second radiation source for heating at least one substrate, at least one transparent shield, disposed between the first radiation source and the substrate, that reduces wavelength ranges of the radiation of at least the first radiation source, at least one radiation detector, which is disposed on the side of the second radiation source, is directed toward the substrate, and measures a radiation at least partially within prescribed wavelength ranges, a device for modulating the radiation emitted from the second radiation source, and a device for determining the radiation emitted from the second radiation source. The invention thus provides a filtering of certain wavelength ranges that come from the first radiation source and that lie in the measurement range of a radiation detector that is directed toward the wafer, or within which lies the measurement range of a radiation detector directed toward the wafer. As a result, the signal-to-background ratio of the substrate radiation to the background radiation of the lamps can be significantly improved. Furthermore, at least the non-filtered lamps that are disposed on the side of the radiation detector are modulated, and the radiation coming from them is determined, as a result of which the reflectivity of the wafer can be determined, which in turn (if the transmissivity of the wafer relative to the measurement wavelength or measurement wavelength range can be made negligible) permits an inference to be drawn with regard to the emissivity of the wafer in the range of the measurement wavelength of the pyrometer. With the aid of the emissivity, and the radiation emitted from the wafer, the temperature of the wafer can now be determined. It is important for the temperature determination that the hemispheric reflectivity and emissivity be determined, which is achieved, for example, by a suitably selected field of view of the pyrometer. For conventional semiconductor wafers, the opening angle of the pyrometer in one plane should be at least between 15° and 180°; however, the field of view can also be greater. This can be realized, for example, by suitable optics. The greater the field of view within at least one field of view plane, the more precisely does the measurement correspond to the hemispheric values, i.e. to the radiation contributions irradiated in a spatial angle of 2B by emission and/or reflection. As a result, disruptive influences, such as surface roughness of the wafer or imprecise positioning of the wafer in the process chamber relative to the pyrometer, can be minimized or eliminated. For Si wafers the opening angle should be approximately 30°. However, this opening angle is dependent on the surface roughness.

Due to the inventive solution of the filtering of the first radiation source by the transparent shield, the heating of the wafer, if this is effected predominately via the first radiation source, and the measurement of the radiation emitted from the wafer, are largely uncoupled from one another via the radiation detector that is disposed on the side of the second radiation source, and the signal-to-background ratio is significantly improved, so that lower temperatures of the wafer, at which the wafer radiates less, for example in the range of 300° C. to 400° C., can still be reliably measured.

Pursuant to one preferred embodiment of the invention, the radiation sources are disposed on opposite sides of the substrate to achieve a separation of the filtered and of the unfiltered radiation. In so doing, in particular the second radiation sources are disposed on only that side of the substrate upon which the radiation detector is directed in order to measure at the pyrometer (radiation detector) essentially only radiation emitted from the wafer and reflected at the wafer.

Pursuant to a further preferred embodiment of the invention, a device is provided for regulating the first radiation sources, which are regulated as a function of the pyrometer-based temperature determination of the wafer in order to subject the wafer to a specific temperature profile. Furthermore, a device for controlling the second radiation sources is advantageously provided, so that they are operated constantly or possibly also after certain set times (desired time points or predefined curves). Thus, preferably exclusively the first, filtered radiation sources are used for the temperature regulation of the wafer. In this way, peaks or rapid fluctuations of the intensity of the reflected lamp radiation, which lie in the range of the measurement wavelength of the pyrometer, are prevented, which facilitates the temperature determination since low requirements are to be set for the dynamic of the temperature system, especially with regard to the determination of the emissivity.

The radiation sources are advantageously heat lamps, especially halogen lamps and/or arc lamps. The radiation sources could, however, also include flash bulbs and/or lasers. Pursuant to an alternative embodiment of the invention, the transparent shield, which absorbs prescribed wavelengths of the lamp radiation or of the radiation of irradiation sources, is formed by the bulbs of the heat lamps or the housing of the radiation source. In this way, the desired filter function can be achieved in a simple and economical manner. In particular, a retrofitting can be effected by a simple replacement of the heat lamps of existing lamp-based RTP systems.

In an alternative embodiment of the invention, the transparent shield is a process chamber wall that lies between the first radiation sources and the substrate, and that absorbs the prescribed wavelength range. The absorbing process chamber wall is disposed on that side of the substrate that is remote from the pyrometer, thus ensuring that no radiation out of the prescribed wavelength range falls upon that side of the substrate that is remote from the radiation detector.

The transparent shield advantageously has at least one filter layer for the absorption of the prescribed wavelengths and, pursuant to one embodiment, can be spatially separated from a further transparent material, for example a process chamber wall of quartz glass. The transparent shield preferably has OH-enriched quartz glass, which preferably absorbs wavelengths between 2.7 μm and 2.8 μm. To prevent an overheating of the transparent shield, which absorbs prescribed wavelengths, a device is provided for cooling the shield. The cooling device preferably has a cooling gas or a cooling liquid.

In a further embodiment of the invention, the transparent shield can include a device that is filled with a fluid or through which a fluid flows, whereby the screening or filter effect is essentially effected by the fluid, or the fluid additionally achieves a screening or filter effect. However, the fluid can also merely serve for cooling the shield. The fluid can be gaseous or liquid, whereby in the case of a liquid it can be a pure liquid, a mixture of liquids, or a solution. In this case, the screen is advantageously formed by a double-walled transparent plate that can be made of quartz and/or OH-enriched quartz, and through which a liquid flows. By means of the liquid, it is additionally possible to control or regulate the temperature of the shield, so that the shield can be kept to as low a temperature as possible in order to minimize the inherent radiation of the shield. If a liquid mixture of non-miscible liquids is selected as the fluid, for example an emulsion in which water is dissolved in oil up to the solubility limit at a prescribed temperature of the oil, it is additionally possible to control the transparency of the shield via the temperature, in that if the temperature drops below the prescribed temperature, then due to the solubility limit the water precipitates in the form of drops or a mist, and the liquid mixture becomes opaque. This is particularly advantageous if the wafer is to be cooled off rapidly. By means of such a screen, in addition to the temperature of the screen, the transparency of the screen can be controlled over a wide wavelength range of several micrometers.

Pursuant to a preferred embodiment of the invention, the radiation detector is a pyrometer. The substrate is preferably a coated semiconductor wafer, especially with a CO— and/or TI-coating and/or a Ni-coating. In order to make a separate transmissivity for the determination of the emissivity superfluous, the wafer preferably has a low transmissivity. The transmissivity of the substrate is preferably less than 0.15.

Pursuant to an alternative embodiment of the invention, a second radiation detector is provided that is directed toward the substrate and that is preferably disposed in such a way that it enables a transmissivity measurement in order to be able to even more precisely determine the emissivity of the substrate. With one embodiment of the invention, the second radiation detector measures radiation beyond the prescribed wavelengths in order to measure non-absorbed and modulated radiation of the radiation sources. In this connection, the second radiation detector preferably measures radiation below and above the prescribed wavelengths in order, via an interpollation preferably a linear interpolation, to be able to determine a transmissivity of the substrate in the range of the prescribed, absorbed wavelength.

Pursuant to an alternative embodiment of the invention, which is especially used if the bulbs of the heat lamps contain the filter function, the second radiation detector is directed toward that side of the substrate that faces away from the second radiation source, and measures radiation having the prescribed wavelength. In this way, radiation coming from the second heat lamps, and that pass as through the wafer, can be used directly for a transmissivity determination.

With the above-described embodiments, the substrate (in general there can also be a plurality of substrates that are preferably stacked one above the other or are disposed essentially next to one another in a plane for the heating in the process chamber) is heated essentially by the first radiation source at low temperatures. The second radiation source essentially serves for the determination of the optical characteristics of the substrate, such as the emissivity, the reflectivity and possibly the transmissivity; its contribution to the heating of the wafer is, at the low temperatures, less than 50% in order, as represented above, to achieve an improved signal-to-background ratio of the measurement arrangement with the radiation detector. At low temperatures, the contribution of the second radiation source is preferably less than 25% of the radiation capacity of the first radiation source. Low temperatures mean temperatures at which the substrate itself irradiates little inherent radiation, or is also partially transparent for the heat radiation. For pure silicon wafers, temperatures below 600° C. are designated as low temperatures, since below this temperature the substrate becomes transparent for the heat radiation (if such is produced by halogen lamps) and the inherent wafer radiation is greatly reduced due to the emissivity, which drops off significantly with the temperature. At temperatures greater than 600° C., silicon becomes opaque and the emissivity achieves a value, of about 0.7, that is nearly constant over the wavelength spectrum of the halogen lamps, as a result of which the radiation given off from the wafer is essentially determined only by the temperature.

Thus, as a function of the wafer temperature, the present invention permits the ratio of the radiations of the first and second radiation sources to be controlled or regulated in such a way that it does not fall below a prescribed signal-to-background ratio for the measurement arrangement via the radiation detector, and hence, for example for silicon wafers, over the entire temperature range of about 250° C. to 600° C. a reliable temperature measurement is possible at a maximum heating-up rate of the wafer. In this connection, the radiation contribution of the second radiation source to the overall radiation contribution can be a function of the wafer temperature, ranging from about 1% at about 200° C. of the wafer to 50% at about 600° C. of the wafer. The control or regulation furthermore makes it possible for the contribution of the second radiation source to exceed 50% and for the wafer to be heated exclusively by the second radiation source. This can be advantageous in particular at temperatures over 600° C., especially with structured wafers in order to enable a careful yet rapid heating-up of structured wafers, for example from the back side of the wafer, so that even at heating rates of 300° C./s, the structures on the wafer are not destroyed.

If the first and second radiation sources are respectively disposed on different sides of the substrate, the substrate can advantageously be heated up on both sides as a function of its temperature and of its optical characteristics, so that one does not fall below a prescribed signal-to-background ratio of the measurement arrangement for the determination of the substrate temperature. Thus, even at low temperatures, a reliable heating-up of the substrate at maximum heating rates is ensured, whereby it is also possible to regulate the heating-up rate with the aid of the still acceptable signal-to-background ratio. This ensures that in particular in the range of low temperatures, the measurement arrangement via the radiation detector itself operates reliably at high heating-up rates of the substrate, and the substrate is increasingly heated from both sides as the temperature increases. The aforementioned advantages and possibilities of the present invention are achieved in particular by the modulation of the second radiation source for the heating of the substrate. It is furthermore also possible to provide a second device for the modulation of the first radiation source. This can be advantageous if, as already described above, in addition the transmissivity is to be determined. Alternatively, or additionally to the above described transmissivity measurement, the first radiation source can be modulated via a modulation that differs from that of the second radiation source in modulation type, modulation frequency or modulation phase. This modulation that differs from the second radiation source can be measured via a further radiation detector, with an at least partially transparent substrate, on that side of the substrate that is opposite the first radiation source. When the modulation of the first radiation source is known, the transmissivity of the substrate can be determined. The modulation of the first radiation source can be determined analogous to the second radiation source, i.e. either directly via measurement of the radiation emitted from the radiation source, or via electrical parameters such as current or voltage of the radiation source and a model of the radiation source that correlates these parameters with the emitted radiation.

The object of the invention is also realized by a method for the thermal treatment of substrates, especially semiconductor wafers, with the following method steps: irradiating the substrate with at least one first and at least one second radiation for heating the substrate, absorbing prescribed wavelengths of the first radiation between a first radiation source and the substrate, measuring a radiation coming from the substrate at the prescribed wavelengths with a radiation detector, which is disposed on the same side as a second radiation source, modulating the second radiation emitted from the second radiation source and determining the second radiation emitted from the second radiation source. By means of this method, the advantages that were already mentioned with respect to the apparatus, namely the improvement of a signal-background ratio by the absorption of prescribed wavelengths of the first radiation, as well as the determination of the emissivity of the wafer by the modulation of the second radiation, are made possible.

BRIEF DESCRIPTION OF THE DRAWINGS

The present invention will be described in greater detail subsequently with the aid of preferred embodiments of the invention with reference to the drawings, in which.

DESCRIPTION OF PREFERRED EMBODIMENTS

The invention will be explained in greater detail subsequently with the aid of preferred embodiments of the present invention.

Figure 1:
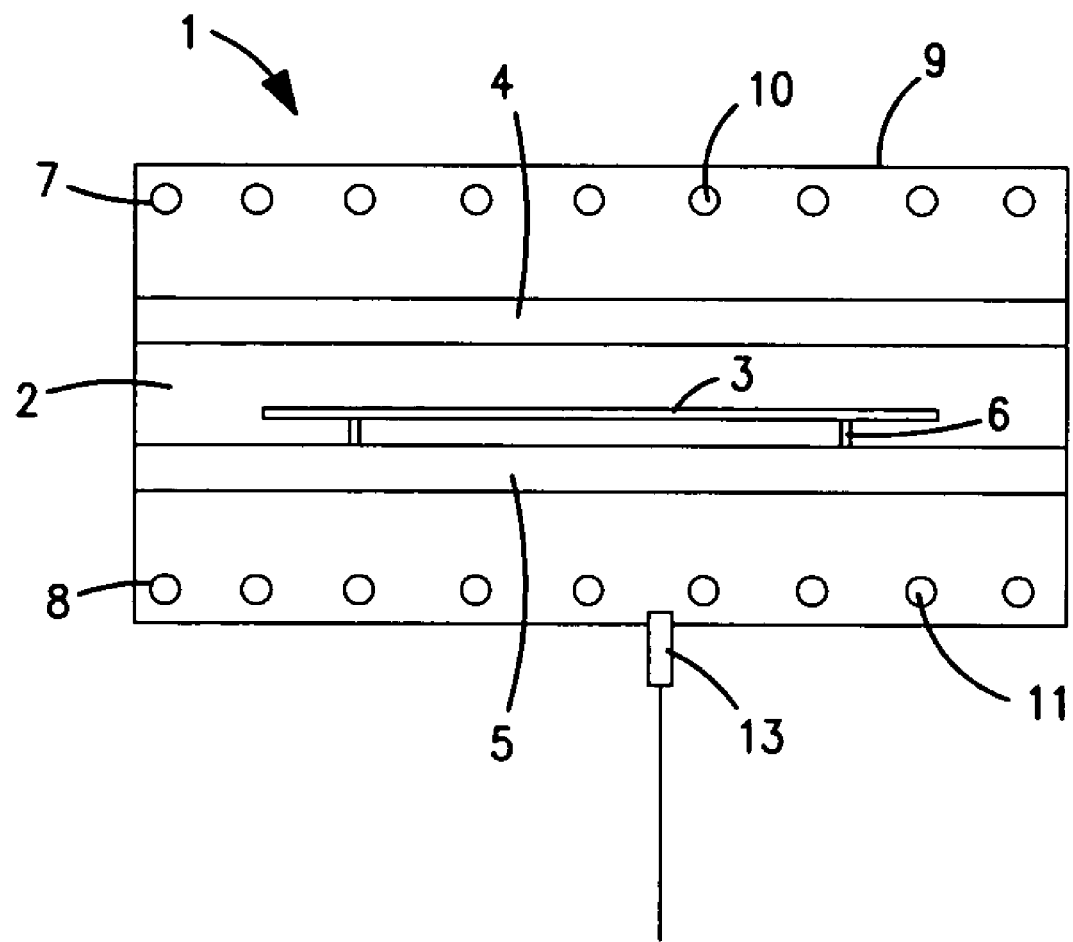
FIG. 1 shows a schematic cross-sectional illustration through a rapid heating unit pursuant to a first embodiment of the present invention.

FIG. 1 shows, in cross-section, a rapid heating system 1 for the rapid heating of semiconductor wafers pursuant to a first embodiment of the invention. A process chamber 2, which accommodates a semiconductor wafer 3, is formed by an upper transparent plate 4 and a lower transparent plate 5, preferably quartz plates. In the process chamber 2, the wafer 3 that is to be processed is placed upon a support device 6. Not indicated are inlets and outlets for process gases via which a gas atmosphere that is suitable for the process can be produced.

Mounted above and/or below the process chamber 2 are heating devices in the form of banks of lamps 7 and 8. The plates 4 and 5 are disposed between the wafer 3 and the banks of lamps 7 and 8, and thus have the effect of a transparent shield for the formation of a closed process chamber. The entire arrangement is surrounded by an external furnace chamber 9, which also forms the side walls of the process chamber 2 and the walls of which can be at least partially reflective. The banks of lamps 7 and 8 each have a plurality of rod-shaped tungsten halogen lamps 10 and 11 that are disposed parallel to one another. Alternatively, however, other lamps could also be used, such as "point-type lamps", whereby the term "point-type lamps" is intended to mean a lamp, the filament lengths of which are less than the diameter of the lamp bulbs, whereby such lamps within the rapid heating system can be operated with essentially vertical and/or horizontal filaments. Furthermore, the lamps (rod lamps and/or "point-type lamps") can be surrounded at least partially by reflectors. It is to be understood that the lamps (rod lamps and/or "point-type lamps") can be disposed at any desired angle relative to the semiconductor wafer 3 with reference to the position of the filament. The wafer 3 is heated with the electromagnetic radiation that is emitted from the lamps. In the embodiment of FIG. 1, the lamp bulbs of the heating lamps 10 of the upper bank of lamps 7 absorb the prescribed wavelengths of the lamp radiation. With the presently preferred embodiment of the invention, the lamp bulbs are made of OH-enriched quartz glass and absorb wavelengths in the range between 2.7 µm and 2.8 µm. In this way, the radiation originating from the upper bank of lamps has a gap in the range between 2.7 to 2.8 µm. The lamp bulbs of the lamps 11 of the lower bank of lamps 8 are essentially transparent for the entire spectrum of the electromagnetic radiation of the lamps, so that the entire spectrum falls upon the wafer 3 in the process chamber 2. Other glasses having a filter effect can also be selected, such as Pyrex®, which has a filter effect in the region of 2.95 micrometers.

The radiation of the lamps 11 of the lower bank of lamps is modulated by a non-illustrated modulation unit having a characteristic parameter, as is known, for example, from the already mentioned DE-A-199 05 524, which to this extent is made the subject matter of the present invention in order to avoid repetition.

To measure the wafer temperature, a pyrometer 13 is provided as a temperature-measuring device that is disposed on the side of the lower bank of lamps and that is directed toward that side of the wafer that faces the lower bank of lamps 8. The measurement range of the pyrometer 13 is in a wavelength range that lies in the gap of the radiation of the upper bank of lamps. For example, the pyrometer 13 measures radiation having wavelengths of 2.7 μm. Thus, the pyrometer 13 essentially measures only radiation that is emitted from the wafer 3, or radiation that proceeds from the second, unfiltered lamps 11 of the lower bank of lamps 8 and is reflected on the wafer. Due to the fact that the radiation of the second lamps 11 has a modulation, the radiation that is emitted from the wafer, and which does not have this modulation, can be differentiated from the reflected lamp radiation. In addition to the wafer radiation, only radiation of the unfiltered lamps 11 of the lower bank of lamps 8 falls into the measurement range of the pyrometer, resulting in an improved signal-to-background ratio relative to the known system, where also radiation of the upper bank of lamps having wavelengths that fall into the measurement range of the pyrometer pass therein, especially if the lower bank of lamps is activated weaker than the upper bank of lamps, so that the upper bank of lamps essentially serves for the heating of the wafer and the lower bank of lamps serves essentially for the measurement of the in-situ reflectivity of the wafer.

In addition to the pyrometer 13, which is directed toward the wafer, a so-called lamp pyrometer is provided that is directed toward at least one of the unfiltered and modulated lamps 11 of the lower bank of lamps 8 in order to determine the radiation intensity thereof. Due to the radiation intensity of the lamps 11, as well as the intensity, measured at the pyrometer 13, of the radiation that originates from the second lamps 11 and that is reflected at the wafer 3—and due to the modulation of the wafer radiation can be differentiated—the reflectivity of the wafer can be determined. The reflectivity, in turn, permits an inference to be drawn regarding the emissivity of the wafer, which is necessary for the temperature determination of the wafer, since the measured wafer radiation by itself, without knowledge of the emissivity, does not yet permit an inference to be drawn regarding the temperature of the wafer.

A further factor for the determination of the emissivity is the transmissivity, i.e. the transparency of the wafer in the range of the measured wavelength. With semiconductor wafers, which inherently have a very low transmissivity, such as highly doped wafers having a metallic layer, the transmissivity need not be separately determined, since it is negligible. It might even be possible to use a constant for the emissivity determination (emissivity=1−transmissivity−reflectivity), so that an adequately precise emissivity determination is possible merely by the determination of the reflectivity.

Alternatively, however, the transmissivity of the wafer can also be measured. For this purpose, a non-illustrated second pyrometer can be provided that is directed, for example, onto that side of the wafer that is remote from the lower bank of lamps, and that also measures radiation in the range of 2.7 μm. Since due to the filter function of the lamp bulbs the upper bank of lamps emits no radiation in this wavelength range, in addition to the actual wafer radiation only that radiation of the unfiltered lamps 11 of the lower bank of lamps that has passed through the wafer falls into the pyrometer. This radiation again has a modulation that enables a differentiation from the wafer radiation. Since the radiation intensity of the unfiltered lamps 11 of the lower bank of lamps 8 is known, the transmissivity of the wafer can now be determined.

Of course, a small portion of the radiation originating from the unfiltered lamps 11 of the lower bank of lamps 8 can also fall into the pyrometer due to multiple reflection at the reflective furnace chamber walls and at the upper side of the wafer. However, this radiation is negligible, and can be taken into account via an initial calibration of the system.

After the reflectivity and the transmissivity are known, the emissivity of the wafer 3 can now be precisely determined. With the aid of the radiation that is emitted from the wafer, and that can be determined either by the pyrometer 13 or the non-illustrated upper pyrometer, the temperature of the wafer can be very precisely determined. This is applicable in particular also at low wafer temperatures (for silicon wafers, temperatures below 450° C.), at which the inherent radiation of the wafer 3 is low, and in particular due to the improved signal-to-background ratio between the wafer radiation and the lamp radiation.

With the aid of the known temperature, the heating devices can now be regulated. With the presently preferred embodiment of the invention, for the regulation exclusively the filtered lamps 10 of the upper bank of lamps 11, and possibly filtered lamps of the lower bank of lamps 8, are utilized. The unfiltered lamps 11 of the lower bank of lamps 8 are either operated constantly or are controlled to operate at certain set points. This prevents jumps or differences in the intensity of the lamp radiation that is used for the reflectivity and possibly transmissivity measurement of the wafer. Thus, for the reflectivity or transmissivity measurement there is always available a known, essentially constant lamp radiation, which enables an improved temperature determination for the wafer.

Figure 2:
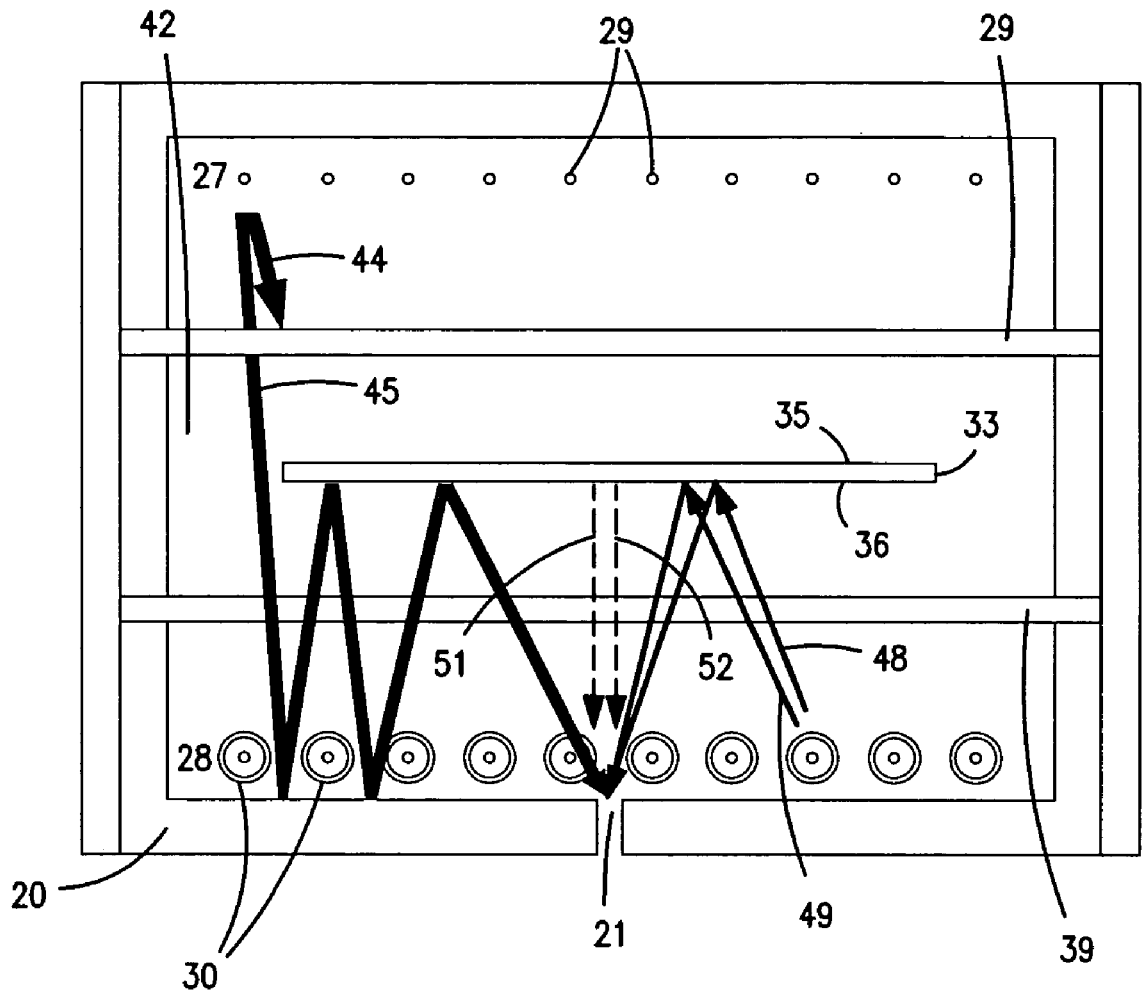
FIG. 2 shows a schematic cross-sectional illustration through a rapid heating unit pursuant to a second embodiment of the present invention.
Figure 2:
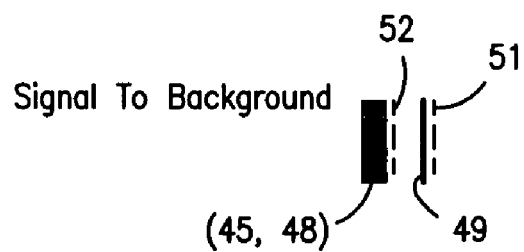

A rapid heating unit pursuant to an alternative embodiment of the invention is illustrated in FIG. 2. It comprises an outer chamber 20 that can be a metal chamber or steel chamber having any desired geometrical cross-section. Not only rectangular but also round chambers are possible. The inner wall of the chamber is preferably partially or entirely reflective by means of a highly reflective coating. The chamber wall is provided with a small opening 21 that permits the escape, from the interior of the chamber, of radiation that is to be measured. Through this opening, the radiation that is to be measured falls either directly into a radiation measurement unit, preferably a pyrometer, that is disposed thereafter and is not shown in the figure, or it is guided via a conduction arrangement, such as optical fibers, thereto.

Respective heating devices in the form of an upper bank of lamps 27 and a lower bank of lamps 28 are provided in or on the chamber cover as well as in or on the chamber base. The banks of lamps 27, 28 preferably have lamps 29 or 30 that can also radiate in the visible light range. In particular, the banks of lamps respectively have a plurality of tungsten halogen lamps 29 and 30 as heat lamps. In contrast to the first embodiment, all of the lamp bulbs of the lamps 29, 30 are comprised of material that is essentially transparent for the entire radiation spectrum of the lamps. In this connection, the lamps can be rod-shaped lamps or also point-type lamps that are arranged in any desired manner. It is also possible to equip the lower bank of lamps 28 with rod-shaped lamps, and the upper bank of lamps 27 with point-type lamps, or vice versa. Both types of lamps within a bank of lamps 27, 28 is also possible. In the event that both banks of lamps 27, 28 are comprised of rod-shaped lamps, arrangements are possible where the rod lamps of the upper bank of lamps 27 are disposed parallel to the rod lamps of the lower bank of lamps 28, or arrangements where the rod lamps of the upper bank of lamps 27 are disposed at an angle relative to the rod lamps of the lower bank of lamps, preferably at a right angle.

Disposed between the bank of lamps 27 and 28 is a substrate 33 that is to be treated, for example a disk-shaped semiconductor wafer, preferably of silicon. The wafer 33 can be uncoated, coated and/or implanted. Coated wafers are advantageously used. In this connection, wafers having a Co or Ti layer, or a combination thereof, are preferred, since the transmission coefficient (transmissivity) thereof at temperatures of 350° C. is less than 0.15. The upper side 35 as well as the underside 36 of the disk-shaped wafer 33 are disposed parallel to the banks of lamps 27 and 28.

Disposed between the upper bank of lamps 27 and the upper side 35 of the wafer 33 is a plate-shaped, transparent shield 38. In the same way, provided between the underside 36 of the substrate 33 and the lower bank of lamps 28 is a transparent shield 39. The shields 38 and 39 span the entire chamber 20, resulting in a division of the inner volume of the chamber 20 into three parts. In particular, as a consequence of the shields 38 and 39 a process chamber 42 is formed in the interior of the chamber 20, with the substrate 33 being disposed in the process chamber. In the inner process chamber 42 it is possible to form a process atmosphere, which is conducive to the desired process, and which has in part aggressive gases and is under high or low pressures, without adversely affecting or contaminating the lamps 29, 30 of the banks of lamps 27 and 28 or the reflective inner wall of the chamber 20. For this purpose, appropriate gas inlets and outlets are provided that, however, are not shown in FIG. 2.

The upper shield 38 is embodied for the absorption of prescribed wavelengths or wavelength ranges from the spectrum of the thermal radiation that is emitted from the upper bank of lamps 27, so that the upper side of the substrate 33 is heated by a thermal radiation that has a wavelength spectrum with at least one gap. Such an absorption effect can be achieved by appropriate filters in the form of one or more coatings of the shield 38, or one or more filter films, which are applied to a transparent base material, i.e. a transparent base plate. Quartz glass is preferably used for the transparent base material.

In the event that filter films are used, these films need not necessarily be applied to the transparent base plate or be in direct contact therewith. Rather, the filter films can be spatially separated from the transparent base plate and be disposed closer to the upper bank of lamps 28 than to the transparent base plate. Such a spatially separated arrangement of filter films and transparent base plate is also designated as a shield 38 in the following.

By means of such coatings and films, it is possible to remove prescribed wavelength ranges from the spectrum of the thermal radiation. These can be one or more wavelength intervals and/or discrete, individual wavelengths.

With the preferred embodiment of the invention, which is illustrated in FIG. 2, the plate-shaped, transparent shield 38 is produced from OH-enriched quartz glass. This quartz glass has the property of absorbing infrared light in the wavelength range of between 2.7 µm and 2.8 µm, as a consequence of which a gap results in this interval in the wavelength spectrum of the thermal radiation. Difficulties that could occur with the coating of quartz plates and with the support of filter films are avoided by the use of an OH-enriched quartz plate.

Since due to the absorption of a portion of the thermal radiation the shield 38 is heated, a cooling thereof may be necessary since a warm shield 38 itself emits thermal radiation, which can adversely affect the desired temperature profile of the substrate 33.

For the cooling of the shield 38, and possibly also of the shield 39, a cooling gas can be provided that flows over the shields externally of the process chamber 42. However, it is also possible to allow the cooling gas to flow through appropriate cooling lines that are disposed in the interior of the shields 38, 39. In such a case, it is also possible to use a cooling liquid such as an oil. If the shield 38 comprises, for example, a transparent base plate having one or more filter films that are spatially separated therefrom, the cooling medium can flow between the films and the transparent base plate.

Whereas portions having prescribed wavelengths are removed by the shield 38 from the thermal radiation produced by the bank of lamps 27, the lower shield 39 is transparent for these wavelengths. This shield preferably involves a plate of conventional quartz glass.

During operation of the unit, the thermal radiation is primarily emitted from the upper bank of lamps 27, with which thermal radiation the wafer 33 is heated to a prescribed temperature. This thermal radiation comprises a spectrum of various wavelengths. In FIG. 2, qualitivity two beams for two different wavelengths of this thermal radiation are illustrated, and in particular the beam 44, which illustrates a light beam having the wavelength 2.7 µm, and the beam 45, which illustrates a light beam having the wavelength 2.3 µm.

Light having the wavelength 2.7 µm is absorbed by the shield 38, which comprises an OH-enriched quartz plate, i.e. the beam 44 cannot pass through the shield 38 and is absorbed by it. In contrast, the wavelength of the beam 45 is beyond the absorption range of the shield 38 and passes through it. Pursuant to the drawing, it also passes through the lower shield 38 and is reflected at the reflective inner wall of the outer chamber 20, again passing through the shield 39 and striking the wafer 33. Since the wafer 33 itself is highly reflective, only a portion of the beam 45 is absorbed at the wafer 33 and the remainder is reflected. This is, incidentally, one of the reasons that the thermal radiation must be so intensive. As one can see from the drawing, multiple repetitions of the reflections are possible, with which always a portion of the beam is absorbed by the wafer. Finally, the beam 45 falls upon the opening 21 in the chamber 20 and passes to the radiation detector.

The lamps 30 of the lower bank of lamps 28 are controlled in such a way that they radiate more weakly than do the lamps 29 of the upper bank of lamps 27. Furthermore, the radiation of the lamps 30 is slightly modulated. The radiation spectrum of the bank of lamps 28 advantageously has the same radiation spectrum as does the bank of lamps 27. The modulated radiation of the bank of lamps 28 is allowed to pass through the shield 39 in an unobstructed manner. Here also a beam 49 having the wavelength 2.7 µm, and a beam 48 for the wavelength 2.3 µm, are indicated. Both beams pass through the shield 39 in an unobstructed manner, are partially reflected by the substrate 33, and generally after multiple reflection between wafer and chamber wall hit the opening 21 and the outer chamber 20.

Radiation is also emitted from the warm wafer 33. In FIG. 2, the wafer radiation is indicated by dashed lines, whereby beam 51 symbolizes a beam of the wavelength 2.7 µm, and beam 52 symbolizes a beam of the wavelength 2.3 µm.

In FIG. 2, the corresponding signal-background ratios are indicated for a measurement of the pyrometer at 2.3 µm and at 2.7 µm. As expected, the signal-background ratio for radiation of the wavelength 2.7 µm is enormously improved relative to the signal-background ratio for radiation of the wavelength 2.3 µm, since with the latter a considerable portion results from the thermal radiation of the upper bank of lamps, and the radiation emitted from the wafer is screened at this wavelength.

For a temperature determination of the wafer, a pyrometer is therefore used that measures radiation having a wavelength of 2.7 µm. At this wavelength, there results a good signal-to-background ratio between the wafer radiation and the radiation reflected at the wafer, since exclusively radiation from the lower bank of lamps 28 with this wavelength falls upon the pyrometer. Due to the modulation of the lamp radiation of the lower bank of lamps, the wafer radiation can be easily separated from the radiation reflected at the wafer in the above described manner. The radiation intensity of the lamps of the lower bank of lamps is, as described above, determined by a pyrometer or in some other manner, such as a measurement of the electrical power consumed by the lamps. Thus, the reflectivity of the wafer, and from that its emissivity, can again be determined in the manner described above. With the aid of the emissivity and the wafer radiation, the temperature of the wafer can now be determined.

The use of the invention is particularly advantageous during the production and processing of wafers that are provided with a Co or Ti layer. Since $CoSi_2$ is a good electrical conductor, silicon wafers are coated with Co and are heated to produce electrical contacts of $CoSi_2$. The formation of $CoSi_2$ takes place in the temperature range between 400° C. and 500° C., i.e. for the defined temperature control of the wafer the control of its temperature below 400° C. is also necessary.

Figure 3:
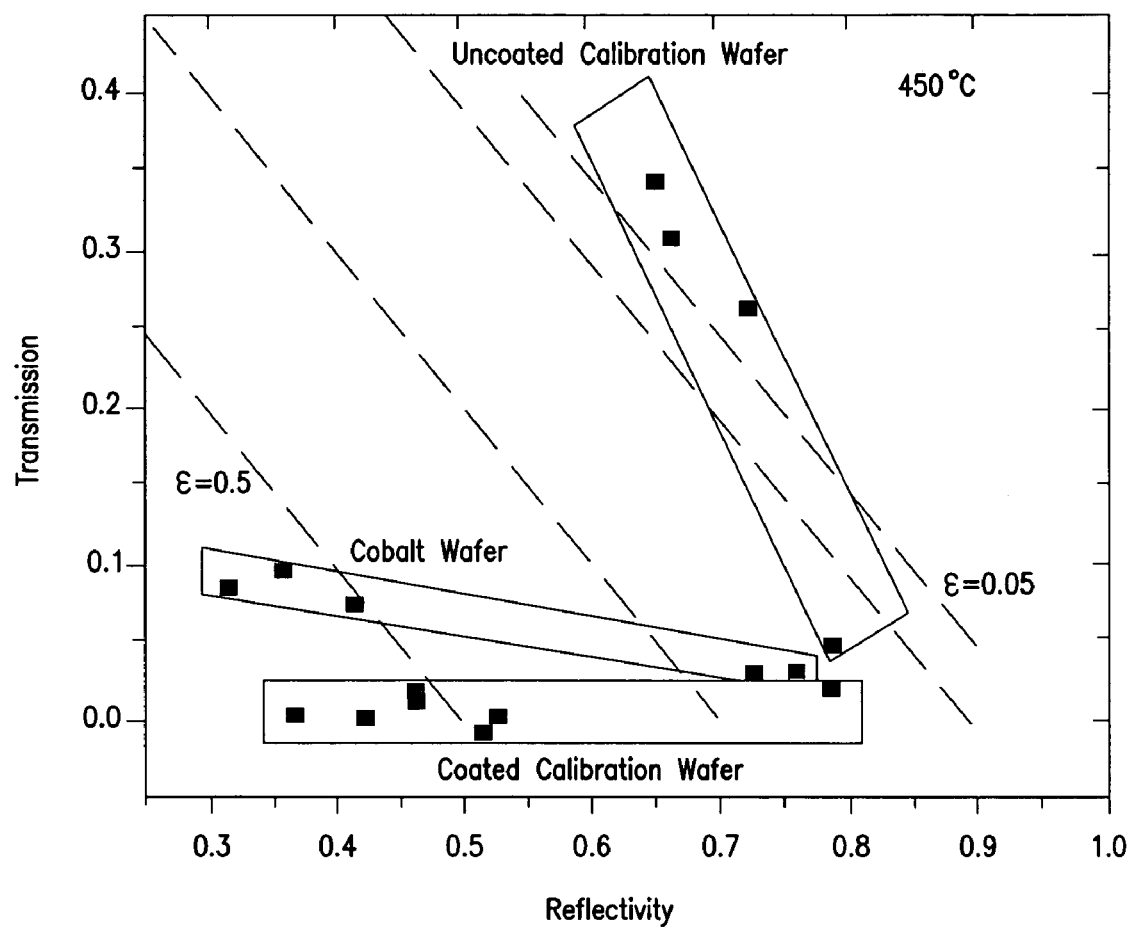
FIG. 3 shows a graph of the relationship between transmissivity and reflectivity for certain wafers.

With the described invention, the specific characteristics of cobalt are utilized. These include a high reflectivity of the surface. As can be seen from FIG. 3, a wafer that is coated with cobalt has a transmissivity that is so low, and is essentially constant, that separate determination is not necessary. In FIG. 3, the transmissivity of a wafer is plotted against the reflectivity. In addition, the lines of constant emissivity are indicated as dotted lines in the graph. These drop from left to right, since transmission, reflectivity and emissivity when added result in 1 at every point in time. In this graph, the transmission values are plotted at different reflectivities for various wafers: once of an uncoated silicon wafer or calibration wafer, for a coated wafer, and for a wafer coated with cobalt. The transmission values of the uncoated wafer are predominantly greater than 0.15, whereas the transmission values of the coated wafer and of the wafer coated with cobalt are always less than 0.15. The wafers coated with cobalt are thus particularly suitable for the above inventive temperature control, since a separate determination of the transmissivity is not necessary.

In general, the wafers can be coated with a metal.

Figure 4:
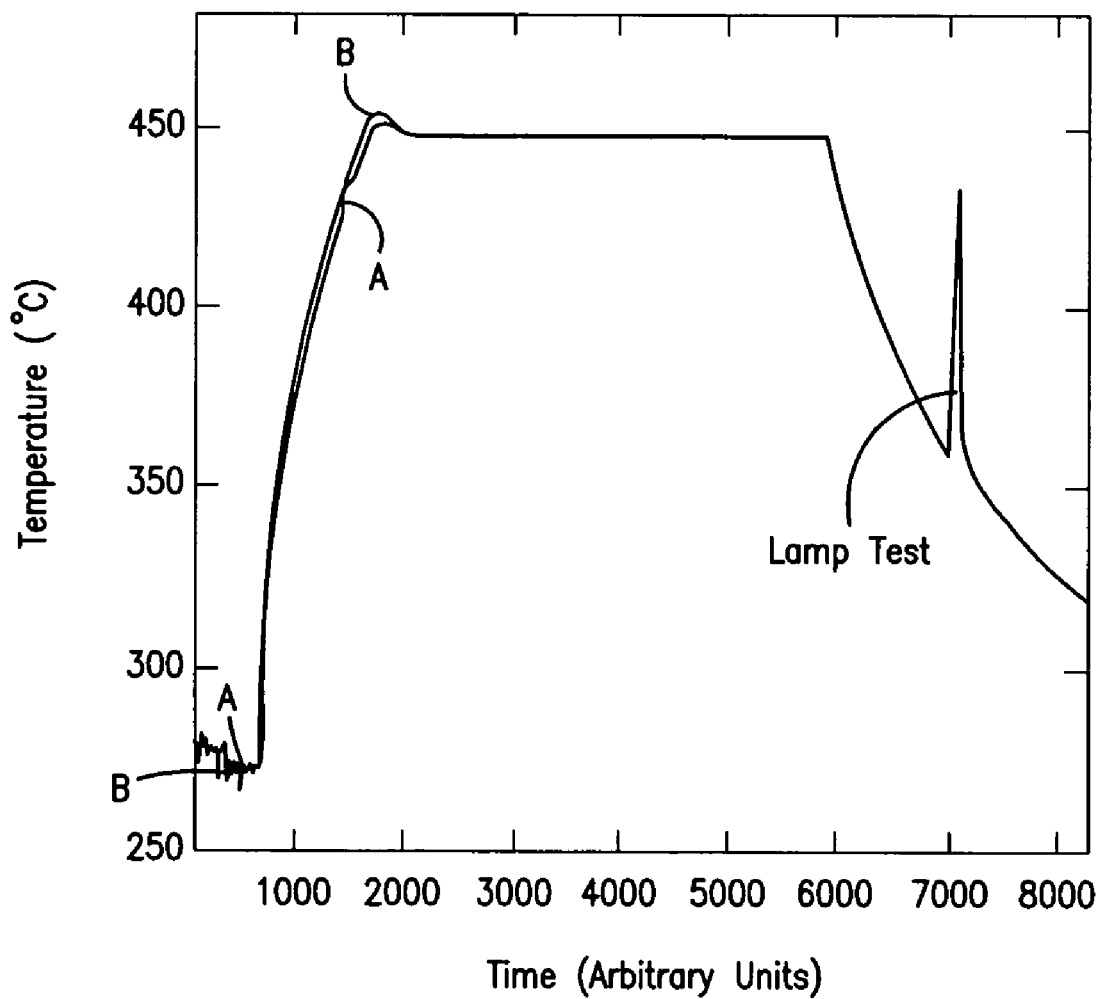
FIG. 4 shows a temperature measurement curve for a wafer that is coated with cobalt and is thermally treated.

In FIG. 4, the temperature profile of a wafer coated with cobalt is shown in arbitrary time units, which wafers were thermally treated in a rapid heating unit pursuant to FIG. 2. The temperature increases to 450° C., remains at this value for a certain period of time, and is subsequently again reduced. The temperature profile was monitored one time with temperature sensors that were in direct contact with the wafer (curve A), and one time via a pyrometer (curve B), whereby the above method was utilized. Worthy of note is the prominent coincidence of the temperature profile detected by the pyrometer with the temperature profile measured by the temperature sensors. Both curves nearly coincide with one another, even for temperatures below 300° C. Although at the beginning the pyrometer shows slight fluctuations, these disappear after institution of the heating process, and the pyrometer curve corresponds with the temperature sensor curve. A brief spike of the pyrometer curve during the cooling-off process is attributable to a lamp test.

In practice, however, wafers are also present having a transmissivity greater than 0.15. In FIG. 3, the uncoated calibration wafer would be such a case. Since the sum of transmissivity, emissivity and reflectivity are always exactly 1, in addition to the above method one can resort to carrying out a parallel transmission measurement that one uses together with the measured reflectivity for determining the emissivity and the wafer temperature.

For this purpose, as with the first embodiment, a further pyrometer is necessary that is directed toward the wafer 33 through an appropriate opening in the chamber 20 above the upper bank of lamps 27.

Figure 5:
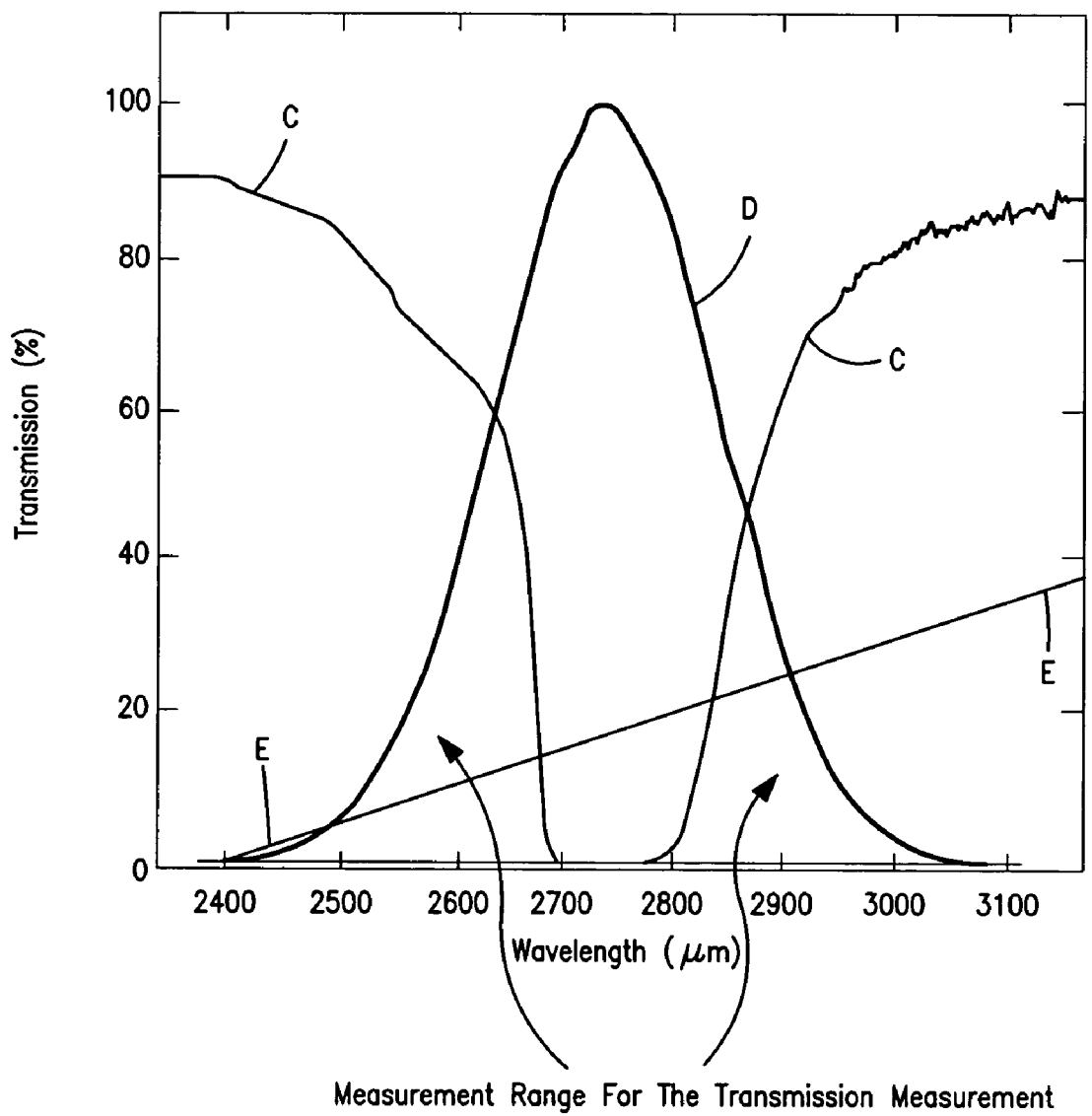
FIG. 5 shows a graph for the determination of the measurement range for a transmissivity measurement pursuant to one embodiment of the present invention.

In FIG. 5, the transmission of the OH-enriched upper quartz plate 4 is indicated as the line C. As one can clearly see, the transmission of this quartz plate is exactly zero for wavelengths between 2.7 µm and 2.8 µm, i.e. the plate is not transparent for these wavelengths. In this wavelength range, however, are the wavelengths for which the lower radiation detector measures the wafer reflectivity for the emissivity determination. In order for the temperature determination to link emissivity and transmissivity, strictly speaking the transmissivity of the wafer must be determined at just this wavelength. This is, however, not possible due to the non-transparency of the upper quartz plate 38 for light of this wavelength.

For this reason, the transmission of light of other wavelengths is measured, and the desired transmission is extrapolated from this data. For this purpose, a filter is disposed ahead of the upper pyrometer and has a wavelength dependent profile of the transmission, as shown by the curve D in FIG. 5. In the region of the optical nontransparency of the quartz plate 4, this filter has its greatest transparency. The transparency of the filter is reduced for smaller as well as greater light wavelengths.

In this way, from the wavelength spectrum to the left and right of the absorption range of the quartz plate 38, two ranges are excised having wavelengths that can reach the pyrometer above the bank of lamps 27, despite the OH-enriched quartz plate 38 and the filter. From a practical standpoint, one selects the profile of the transmission curve for the filter in such a way that the areas at the edges of the absorption range for the quartz, which areas are within the filter curve and the quartz curve, are approximately the same size.

If one is dealing with a wafer having a transmission value that changes only slightly or nearly linearly with the wavelength, such as, for example, the line E indicated in FIG. 5 for the transmissivity of an exemplary wafer, one can measure the transmission through the wafer for a wavelength from the range to the left of the absorption range of the quartz, and can also measure the transmission through the wafer for a wavelength from the range to the right of the absorption range of the quartz. Since the transmission of the wafer changes only slightly or nearly linearly with the wavelength, the transmission for the desired wavelength from the absorption range of the quartz can be determined via an average value formation or approximation. By linking this transmission measurement with the above described measurement of the reflectivity of the wafer, one can now determine the emissivity, and in particular even for wafers having a transmission level that is greater than 0.15. This then enables a reliable temperature control in the ranges below 400° C. to approximately 300° C.

For the above transmission measurement it is necessary that the lamps of the lower bank of lamps be modulated in such a way that the radiation of the lamps of the respective upper and lower banks of lamps can be differentiated. If such a differentiation is provided by appropriate modulation, it is also possible to use a radiation detector for the transmission measurement, for example a pyrometer, that is disposed below the lower bank of lamps 28. This can then measure, in the above manner, radiation that is emitted from the upper bank of lamps, is again modulated, and is thus differentiated from the wafer radiation and from the radiation of the lower bank of lamps. The radiation that falls upon the pyrometer due to multiple reflection can either be taken into account by a calibration of the system, or it is disregarded during the transmissivity determination.

Preferred, however, is the first example of the transmissivity measurement, since as with the first embodiment the upper bank of lamps is used for the temperature regulation of the wafers, whereas the lower bank of lamps is kept constant or is controlled to operate at certain set times (or also desired values or desired curves). In this way, there results for the reflection and transmission measurement an essentially constant intensity of the lamp radiation, or one that changes in a known manner. With the lamps that are used for the temperature regulation, the intensity of the lamp radiation can, in contrast, change rapidly, so that intensity peaks result that can adversely affect the reflection and transmission measurement in the event that these intensity peaks are detected by the pyrometer, which situation is largely avoided by the invention.

Although the invention was described with the aid of preferred embodiments, it is not limited to the concrete embodiments. For example, for the determination of the radiation intensity of the lamps, it is possible, instead of a lamp pyrometer, to use some other suitable measuring device, for example a device that calculates the intensity with the aid of the electrical power that is consumed. Furthermore, individual features of the above described embodiments can be interchanged in any compatible manner or can be combined with one another in any desired manner.

The specification incorporates by reference the disclosure of German priority documents 101 25 318.4 filed May 23, 2001 and 102 22 879.5 filed May 23, 2002.

The present invention is, of course, in no way restricted to the specific disclosure of the specification and drawings, but also encompasses any modifications within the scope of the appended claims.

The invention claimed is:

1. A method for thermally treating substrates, including the steps of:
   irradiating a substrate with at least one first radiation for heating said substrate, wherein said first radiation is emitted from at least one first radiation source;
   absorbing prescribed wavelengths of said first radiation between said first radiation source and said substrate;
   irradiating said substrate with at least one second radiation for heating said substrate, wherein said second radiation is emitted from at least one second radiation source and includes radiation that lies in said prescribed wavelengths and strikes said substrate;
   measuring a radiation coming from said substrate at said prescribed wavelengths with a radiation detector that is disposed on the same side as is said second radiation source;
   modulating said second radiation that is emitted by said second radiation source; and
   determining said second radiation being emitted from said at least one second radiation source due to the measurement.

2. A method according to claim 1, wherein said first and said second radiation are directed toward said substrate from opposite sides.

3. A method according to claim 1, which includes regulating said first radiation source.

4. A method according to claim 1, which includes generating the first and second radiation with heating lamps.

5. A method according to claim 4, which includes absorbing the prescribed wavelengths of said first radiation by bulbs of first ones of said heating lamps.

6. A method according to claim 1, which includes absorbing said prescribed wavelengths of said first radiation by a process chamber wall that is disposed between said first radiation source and said substrate.

7. A method according to claim 1, wherein wavelengths of said first radiation between 2.7 and 2.8 $\mu$m are absorbed.

8. A method according to claim 1, which includes cooling an element that absorbs said prescribed wavelengths.

9. A method according to claim 8, which includes cooling said element with a cooling gas or a cooling liquid.

10. A method according to claim 1, wherein said radiation coming from said substrate is measured with a pyrometer.

11. A method according to claim 1, wherein radiation coming from said substrate is measured with a further radiation detector.

12. A method according to claim 11, wherein said further radiation detector measures radiation beyond said prescribed wavelengths.

13. A method according to claim 12, wherein said further radiation detector measures radiation below and above said prescribed wavelengths.

14. A method according to claim 11, wherein said further radiation detector is directed toward that side of said substrate that is remote from said second radiation source and measures radiation having the prescribed wavelength.

15. A method according to claim 1, wherein radiation originating from said first radiation source contributes less than 50%, and preferably less than 25%, to the heating of said substrate at low temperatures.

* * * * *